United States Patent
Adler et al.

(10) Patent No.: US 8,660,512 B2
(45) Date of Patent: Feb. 25, 2014

(54) HIGH-FREQUENCY PRESTAGE AND RECEIVER

(76) Inventors: Bernd Adler, Neubiberg (DE); Feridoon Jalili, Gistrup (DK); Mikael Bergholz Knudsen, Gistrup (DK); Michael Wilhelm, Mammendorf (DE)

( * ) Notice: Subject to any disclaimer, the term of this patent is extended or adjusted under 35 U.S.C. 154(b) by 752 days.

(21) Appl. No.: 12/563,607

(22) Filed: Sep. 21, 2009

(65) Prior Publication Data

US 2010/0081407 A1    Apr. 1, 2010

(30) Foreign Application Priority Data

Sep. 30, 2008 (DE) .................... 10 2008 049 668

(51) Int. Cl.
*H04B 1/10* (2006.01)
(52) U.S. Cl.
USPC ...... 455/307; 455/272; 455/562.1; 455/575.7
(58) Field of Classification Search
USPC ........................................................ 455/307
See application file for complete search history.

(56) References Cited

U.S. PATENT DOCUMENTS

| | | | | |
|---|---|---|---|---|
| 4,621,201 A | * | 11/1986 | Amdahl et al. | 326/11 |
| 6,407,732 B1 | * | 6/2002 | Stiens et al. | 345/204 |
| 7,233,775 B2 | | 6/2007 | De Graauw | |
| 7,454,183 B2 | * | 11/2008 | Moorti et al. | 455/277.1 |
| 7,532,871 B2 | * | 5/2009 | Nishimura et al. | 455/130 |
| 7,760,810 B2 | * | 7/2010 | Koga et al. | 375/260 |
| 8,036,621 B2 | * | 10/2011 | Nakagawa | 455/277.2 |
| 2005/0079847 A1 | * | 4/2005 | Arafa | 455/272 |
| 2007/0066245 A1 | * | 3/2007 | Snider | 455/78 |
| 2009/0197638 A1 | * | 8/2009 | Park et al. | 455/553.1 |
| 2009/0323872 A1 | * | 12/2009 | Haller | 375/347 |

* cited by examiner

*Primary Examiner* — Ajibola Akinyemi
(74) *Attorney, Agent, or Firm* — Eschweiler & Associates, LLC

(57) ABSTRACT

A filter stage for use in a receiver includes a switch with an input coupled to an antenna terminal, a first output and a second output; a first filter of a first type coupled to the first output; and a second filter of a second type different from the first type, coupled to the second output. A receiver includes a filter stage as mentioned above; and a switching unit coupled to the filter stage for controlling a switching state of the switch, to selectively connect the antenna terminal to the second output, depending on a selection signal.

4 Claims, 2 Drawing Sheets

HIGH-FREQUENCY PRESTAGE AND RECEIVER

This application claims priority to German Patent Application 10 2008 049 668.5, which was filed Sep. 30, 2008 and is incorporated herein by reference.

TECHNICAL FIELD

The present invention relates to a filter stage for use in a receiver and to a receiver.

BACKGROUND

In wireless communication, information is transmitted using a radio communication channel. For performing the transmission, a useful signal including the information is modulated on an HF carrier for generating a modulated HF signal and fed into the radio communication channel by way of an antenna. The modulated HF signal propagates through the radio communication channel and is received as an HF reception signal by a receiver device. The receiver device is arranged to process the HF reception signal for recovering the useful signal.

Through current trends in mobile communications, the industry is faced with the demand for applications with a high data rate. These may be, e.g., video telephony, video or network games, streaming multimedia, web browsing, and others. Consequently, telecommunication devices are arranged for multi-band and/or multi-mode operation. Within the UMTS (universal mobile telecommunication system) or W-CDMA (wideband code division multiple access) standards, communication standards allowing for transmission at high data rates are being developed, such as HSDPA (high speed downlink packet access) or HSUPA (high speed uplink packet access). Other standards are defined by WLAN (wireless local area network) in IEEE 811.11 or by WIMAX.

Usually, high data rates necessitate good signal quality in a receiver device, i.e., a relatively high signal-to-noise ratio (SNR) in a receiver chain of both a terminal, such as a mobile telephone, and a base station. With increasing distance between a transmitter device and a receiver device, the HF reception signal may become distorted with respect to the modulated HF signal.

If the terminal is near the edge of a cell surrounding a base station, the reception quality in the receiver device is limited by thermal noise and a noise figure of the receiver device itself. Furthermore, the HF reception signal is distorted by a noise figure of the radio communication channel caused by mechanisms such as Rayleigh fading, thermal noise of other electronic devices, technical noise, e.g. caused by motor vehicle ignition, any natural noise, e.g. discharges, such as lightning, and others.

One possible solution for achieving a high data rate would be to increase the number of base stations to minimize the maximum distance between a terminal device and a base station. However, this necessitates much financial investment in base station infrastructure.

Another possible solution is to increase the number of reception paths in the receiver device. As a result, a more accurate reconstruction of the useful signal can be achieved. This concept is also referred to as a "diversity receiver." A diversity receiver usually necessitates a number of internal devices in the receiver chain, and it is desirable to reduce this number to allow for a simpler and more inexpensive architecture of a diversity receiver.

SUMMARY OF THE INVENTION

According to an embodiment, a filter stage for use in a receiver may have a switch with an input coupled to an antenna terminal, a first output and a second output. A first filter of a first type is coupled to the first output and a second filter of a second type different from the first type is coupled to the second output.

According to another embodiment, a receiver may have a filter stage for use in a receiver. The filter stage may have a switch with an input coupled to an antenna terminal, a first output and a second output. A first filter of a first type is coupled to the first output and a second filter of a second type different from the first type is coupled to the second output. A switching unit is coupled to the filter stage for controlling a switching state of the switch, to selectively connect the antenna terminal to the second output, depending on a selection signal.

BRIEF DESCRIPTION OF THE DRAWINGS

Embodiments of the present invention will be detailed subsequently referring to the appended drawings, in which.

DETAILED DESCRIPTION OF ILLUSTRATIVE EMBODIMENTS

Figure 1:
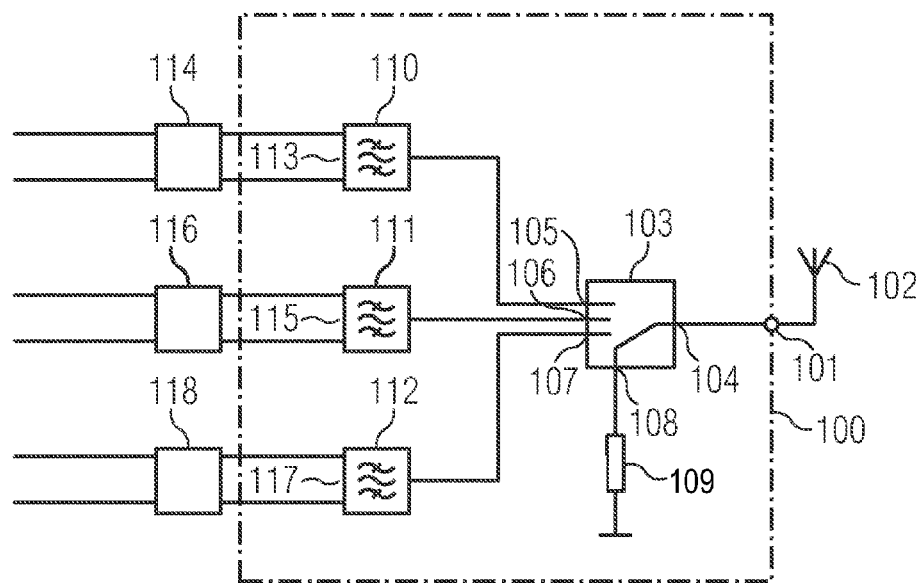
FIG. 1 is a block circuit diagram of an HF filter stage in a receiver.

FIG. 1 is a block circuit diagram of an embodiment of the HF filter stage in a receiver. An HF filter stage 100 (illustrated in dashed lines) includes a first input terminal 101 coupled to an antenna 102. The antenna 102 takes up a radio signal transmitted via a radio channel. Here, the antenna 102 may be arranged both inside and outside the HF filter stage 100.

Furthermore, the HF filter stage 100 includes a switching unit 103. The switching unit 103 comprises a first input 104 coupled to the first input terminal 101. It further comprises a first output 105, a second output 106, a third output 107 and a fourth output 108. According to a chosen switching state, the switching unit 103 connects the input 104 to one of the first output 105, the second output 106, the third output 107 or the fourth output 108.

The fourth output 108 is connected to an impedance 109, which is realized as a resistor in the HF filter stage 100 shown.

The first output 105 is connected to a first filter element 110. The second output 106 is connected to a second filter element 111. The third output 107 is connected to a third filter element 112.

The first filter element 110 may be realized as a bandpass filter, like in the embodiment illustrated. The same applies in the case of the second filter element 111 and the third filter element 112. The filter elements comprise a certain filter type. For example, the different filter types include a micromechanical filter, for example, SAW (surface acoustic wave) or BAW (bulk acoustic wave) filters or an integrated filter, such as an LC circuitry. The LC circuitry may be integrated or formed completely or partially in a single semiconductor device with other devices of the HF filter stage 100.

In various other embodiments, as an alternative, different kinds of filter elements, such as a low-pass filter or a high-pass filter, can be used.

The first filter element 110 comprises a differential output 113 connected to a first demodulator 114. The second filter element 111 comprises a differential output 115 connected to a second demodulator 116. The third filter element 112 comprises a differential output 117 connected to a third demodulator 118.

The first demodulator 114, the second demodulator 116 and the third demodulator 118 each form a reception path allowing for band-specific demodulation of an incoming radio signal, for example. To this end, the demodulators may comprise various components, such as oscillators, control logic, etc., collectively or separately. In other embodiments, the reception paths may be designed for the demodulation of different transmission types (modulation types).

In operation, the HF filter stage 100 may be set to four different switching states. In three switching states, the signal received from the antenna 102 is fed to one of the reception paths. In a fourth switching state, the switching unit 103 connects the input 104 to the fourth output 108. The received signal is reflected at the impedance 109.

The impedance 109 is chosen from short-circuit to idle, so that a phase angle caused by the reflection allows for optimizing mutual coupling between the antenna 102 and the further antenna, such as a transmission antenna. The fourth switching state enables the adjustment during a transmission mode of a transmitter/receiver including the HF filter stage 100. Since the HF filter stage 100 directly connects the filter elements and the antenna 102 in the other switching states, the filter elements are exposed to the power of the reception signal. Due to mutual coupling with a transmitter antenna, the filter elements will be exposed to a high power level in a transmission state. This would result in the adjustment of higher power control requirements of the filter elements on a reception path. As a result, general HF power of the filter elements is deteriorated and causes, e.g., an insertion loss. This scenario may be avoided by switching the HF filter stage 100 to a fourth switching state during the transmission mode.

Figure 2:
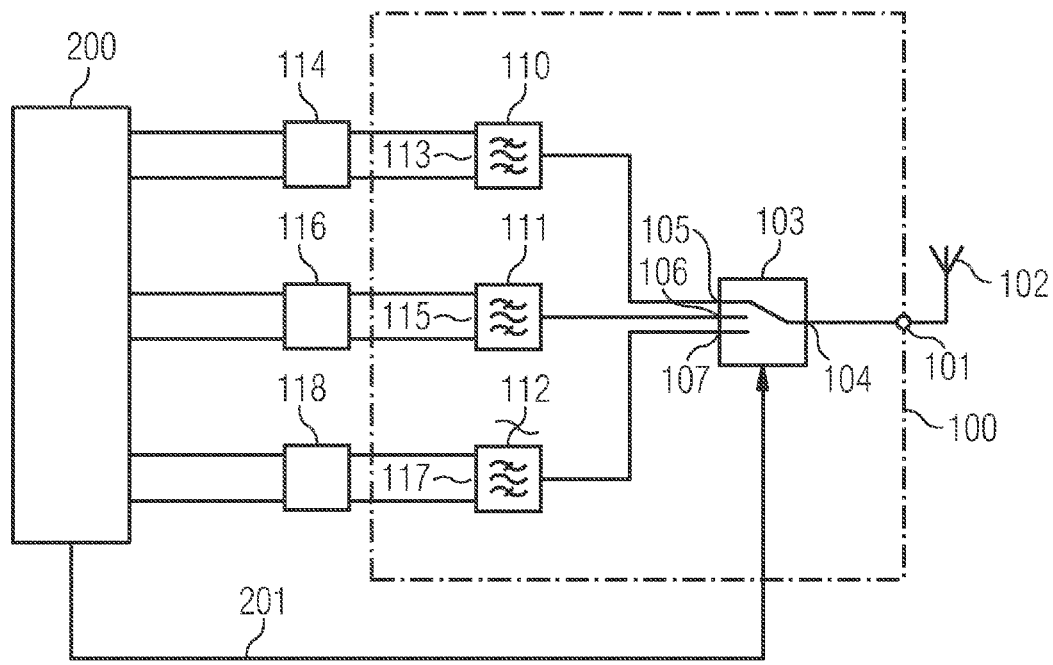
FIG. 2 is a block circuit diagram of a further embodiment of an HF filter stage in a receiver.

FIG. 2 is a block circuit diagram of a further embodiment of an HF filter stage in a receiver; the receiver includes an HF filter stage 100 and a baseband unit 200.

The baseband unit 200 may be any digital circuitry for processing a digital baseband signal. It may be implemented as a microprocessor or a DSP (digital signal processing) unit. In various other embodiments, the baseband unit 200 may be an interface unit, such as defined by the DigRF™ standard, in order to allow for the connection of the diversity receiver to an external baseband processor.

An HF filter stage 100 (illustrated in dashed lines) comprises a first input terminal 101 coupled to an antenna 102. The antenna 102 captures a radio signal transmitted via a radio channel. The antenna 102 may here be arranged both inside and outside the HF filter stage 100.

Furthermore, the HF filter stage 100 includes a switching unit 103. The switching unit 103 comprises an input 104 coupled to the first input terminal 101. It further comprises a first output 105, a second output 106 and a third output 107. According to a chosen switching state, the switching unit 103 connects the input 104 to one of the first output 105, the second output 106 or the third output 107.

The baseband unit 200 is coupled to the switching unit 103 by way of a control line 201. A switching state of the switching unit 103 is set by a switching signal generated by the baseband unit 200 and forwarded to the switching unit 103 via the control line 201.

The first filter element 110 comprises a differential output 113 connected to a first demodulator 114. The second filter element 111 comprises a differential output 115 connected to a second demodulator 116. The third filter element 112 comprises a differential output 117 connected to a third demodulator 118.

The first output 105 is connected to a first filter element 110. The second output 106 is connected to a second filter element 111. The third output 107 is connected to a third filter element 112.

The first filter element 110 may be realized as a bandpass filter, like in the embodiment illustrated. The same applies in the case of the second filter element 111 and the third filter element 112. The filter elements comprise a certain filter type. For example, the different filter types include a micromechanical filter, for example, SAW (surface acoustic wave) or BAW (bulk acoustic wave) filters, or an integrated filter, such as LC circuitry. The LC circuitry may be integrated or formed completely or partially within a single semiconductor device, with other devices of the HF filter stage 100.

In various other embodiments, different kinds of filter elements, such as a low-pass filter or a high-pass filter, may be used as an alternative.

The first demodulator 114, the second demodulator 116 and the third demodulator 118 each form a reception path allowing for band-specific demodulation of the incoming radio signal, for example. The respective demodulated signal is fed to the baseband unit 200. To this end, the demodulators may comprise various components, such as oscillators, control logic, etc., collectively or separately. In other embodiments, the reception paths are designed for the demodulation of various transmission types (modulation types).

For detecting various frequency bands, it is advantageous to have various parallel reception paths, as shown in the embodiment of FIG. 2. In one exemplary case, the first filter element 110 is a band-pass filter with a pass-band from 960 MHz to 869 MHz. The second filter element 111 is a band-pass filter with a pass-band from 1990 MHz to 1805 MHz. The third filter element 112 is a band-pass filter with a pass-band from 2170 MHz to 2110 MHz. In other embodiments, additional or fewer reception paths may be provided, allowing for the reception of other operating bands or allowing for a different allocation of a reception path to a finer or rougher operation band.

Here, the first filter element 111 is formed as a BAW filter. The second filter element 112 and the third filter element 113 are formed as SAW filters.

If the receiver is not operating, the first input terminal 101 is coupled to the filter element 111 by means of the switching unit 103. Thus, the antenna input is terminated by a BAW filter. A BAW filter is suited to be exposed to power emitted by an adjacent transmitter, without degradation of the filter. The use of SAW filters for the remaining filter elements allows for inexpensive realization of the HF filter stage.

Figure 3:
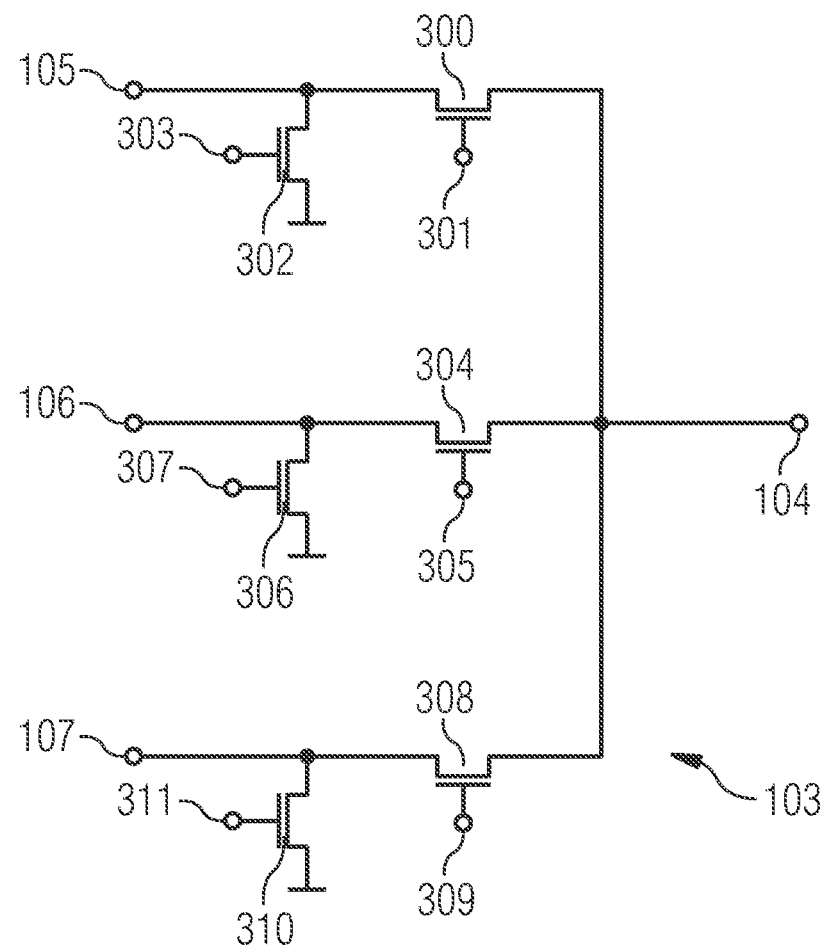
FIG. 3 is a block circuit diagram of an exemplary switching unit for use in an embodiment of the invention.

FIG. 3 is a block circuit diagram of an exemplary switching unit for use in an embodiment of the invention. The switching unit may be arranged as a switching unit 103 in one of the depicted embodiments of FIG. 1 or FIG. 2. The switching unit 103 comprises an input 104, a first output 105, a second output 106 and a third output 107. The input 104 is connected to the first output 105 via a source-drain connection of a first series transistor 300. A gate terminal of the first series transistor 300 is connected to a first control input 301. A first parallel transistor 302 is arranged between the first series transistor 300 and the first output 105. A gate terminal of the first parallel transistor 302 is connected to a second control input 303. Furthermore, the input 104 is connected to the second output 106 via a source-drain connection of a second series transistor 304. A gate terminal of the second series transistor 304 is connected to a third control input 305. A second parallel transistor 306 is arranged between the second series transistor 304 and the second output 106. A gate terminal of the second parallel transistor 306 is connected to a fourth control input 307. The input 104 is further connected to the third output 107 via a source-drain connection of a third series transistor 308. A gate terminal of the third series transistor 308 is connected to a fifth control input 309. A third parallel transistor 310 is arranged between the third series transistor 308 and the third output 107. A gate terminal of the third parallel transistor 310 is connected to a sixth control input 311.

Several control voltages are provided at the first control input 301, the second control input 303, the third control input 305, the fourth control input 307, the fifth control input 309 and/or the sixth control input 311. These voltages may, for example, be provided by a control unit, such as the baseband unit 200 shown in FIG. 2. In various embodiments, the control voltages provided may correspond to a bit-like form. In these cases, a control voltage may either assume a high potential corresponding to a logic "1" or a low potential corresponding to a logic zero. A control voltage provided at the gate terminal of a series transistor usually is the inverse of a control voltage provided at the gate terminal of a parallel transistor of the same signal path. A control voltage provided at the gate terminal of a series transistor usually also is the inverse of control voltages provided at gate terminals of series transistors on other signal paths. As a result, three states of control voltages may be arranged so as to allow for three different switching states:

| V1 (input 301) | V2 (input 303) | V3 (input 305) | V4 (input 307) | V5 (input 309) | V6 (input 311) | Input 104 connected to: |
|---|---|---|---|---|---|---|
| high | low | low | high | low | high | first output 105 |
| low | high | high | low | low | high | second output 106 |
| low | high | now | high | high | low | third output 107 |

As shown in the diagram, V1 corresponds to the control voltage applied to the first control input 301. V2 corresponds to the control voltage applied to the second control input 303. V3 corresponds to the control voltage applied to the third control input 305. V4 corresponds to the control voltage applied to the fourth control input 307. V5 corresponds to the control voltage applied to the fifth control input 309, and V6 corresponds to the control voltage applied to the sixth control input 311.

Consequently, in a state of connecting the input 104 to one of the outputs 105, 106 or 107, the series transistor of the respective signal path is turned on, while the parallel transistor is turned off. This enables the signal provided at the input to be forwarded to the selected output. At the same time, the series transistor is switched off on all other signal paths, while the parallel transistor is switched on. A signal provided at the input is therefore blocked against forwarding to other outputs. The channel widths of the series transistors are chosen to be equal. The channel widths of the parallel transistors are also chosen to be equal. Yet, the values may differ, e.g., with respect to optimum implementation with respect to a defined pass-band of a signal path. The channel widths of the series transistors, in relation to the channel widths of the parallel transistors, are chosen so as to achieve a tradeoff between insertion loss in the switched-on operation and insulation in the switched-off operation. Low insertion loss may be achieved by choosing a larger channel width of the series transistor as compared with the channel width of the parallel transistor. Opposite limitations may allow for good insulation in the switched-off operation.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. A filter stage for use in a receiver, the filter stage comprising:
   a switch with an input coupled to an antenna terminal, a first output and a second output;
   a first filter of a first type coupled to the first output, wherein the first filter of the first type comprises a bulk acoustic wave (BAW) filter;
   a second filter of a second type different than the first type, the second filter coupled to the second output, wherein the second filter of the second type comprises a surface acoustic wave (SAW) filter; and
   a control circuit configured to couple the antenna terminal to the first output via the switch when the receiver is not operating.

2. The filter stage according to claim 1, wherein the switch further comprises a third output, the filter stage further comprising a third filter coupled to the third output.

3. The filter stage according to claim 2, wherein the third filter comprises a filter of the second type.

4. A filter stage for use in a receiver, the filter stage comprising:
   a switch with an input coupled to an antenna terminal, a first output and a second output;
   a first filter of a first type coupled to the first output, wherein the first filter of the first type comprises a bulk acoustic wave (BAW) filter;
   a second filter of a second type different than the first type, the second filter coupled to the second output, wherein the second filter of the second type comprises a surface acoustic wave (SAW) filter; and
   a control circuit configured to couple the antenna terminal to the first output via the switch when the receiver is not operating, wherein the switch comprises:
   a first transistor coupled between the input and first output;
   a second transistor coupled between the first output and a reference voltage node;
   a third transistor coupled between the input and the second output; and
   a fourth transistor coupled between the second output and the reference voltage node.

* * * * *